(12) United States Patent
Watanabe

(10) Patent No.: US 9,437,584 B2
(45) Date of Patent: Sep. 6, 2016

(54) ELECTRONIC APPARATUS

(71) Applicant: Seiko Epson Corporation, Tokyo (JP)

(72) Inventor: Kenya Watanabe, Suwa (JP)

(73) Assignee: Seiko Epson Corporation (JP)

( * ) Notice: Subject to any disclaimer, the term of this patent is extended or adjusted under 35 U.S.C. 154(b) by 32 days.

(21) Appl. No.: 14/018,731

(22) Filed: Sep. 5, 2013

(65) Prior Publication Data

US 2014/0077390 A1    Mar. 20, 2014

(30) Foreign Application Priority Data

Sep. 14, 2012 (JP) ................. 2012-202374

(51) Int. Cl.
| | |
|---|---|
| *H01L 25/04* | (2014.01) |
| *H01L 25/16* | (2006.01) |
| *H01L 23/34* | (2006.01) |
| *H01L 25/065* | (2006.01) |
| *H01L 25/11* | (2006.01) |
| *H01L 23/40* | (2006.01) |
| *B81C 1/00* | (2006.01) |

(52) U.S. Cl.
CPC ........... *H01L 25/16* (2013.01); *B81C 1/00238* (2013.01); *H01L 23/34* (2013.01); *H01L 23/4012* (2013.01); *H01L 25/043* (2013.01); *H01L 25/0657* (2013.01); *H01L 25/117* (2013.01); *B81C 2203/0792* (2013.01); *H01L 2224/48091* (2013.01); *H01L 2924/1461* (2013.01)

(58) Field of Classification Search
CPC ............. H01L 25/0657; H01L 25/043; H01L 23/4012; H01L 25/117
See application file for complete search history.

(56) References Cited

U.S. PATENT DOCUMENTS

| | | | |
|---|---|---|---|
| 7,807,583 B2 | 10/2010 | Van Aelst et al. | |
| 7,919,841 B2 | 4/2011 | Park et al. | |
| 2006/0286822 A1* | 12/2006 | Thomas | H01L 25/0657 439/55 |
| 2008/0048335 A1* | 2/2008 | Han | H01L 25/0657 257/774 |
| 2008/0083975 A1 | 4/2008 | Chao et al. | |
| 2008/0290496 A1 | 11/2008 | Park | |
| 2009/0194829 A1 | 8/2009 | Chung et al. | |
| 2010/0270630 A1 | 10/2010 | Fujii et al. | |

FOREIGN PATENT DOCUMENTS

| | | |
|---|---|---|
| JP | 2005-153067 A | 6/2005 |
| JP | 2005-335022 A | 12/2005 |
| JP | 2006-245311 A | 9/2006 |
| JP | 2008-053708 A | 3/2008 |
| JP | 2008-053734 A | 3/2008 |
| JP | 2008-229833 A | 10/2008 |
| JP | 2008-288384 A | 11/2008 |
| JP | 2009-124013 A | 6/2009 |
| JP | 2010-112763 A | 5/2010 |
| WO | WO-2007-147137 A2 | 12/2007 |
| WO | WO-2010-047228 A1 | 4/2010 |

* cited by examiner

*Primary Examiner* — Amar Movva
(74) *Attorney, Agent, or Firm* — Harness, Dickey & Pierce, P.L.C.

(57) ABSTRACT

An electronic apparatus includes a multilayered structure in which a plurality of semiconductor chips provided with semiconductor devices are stacked, penetrating electrodes penetrating the semiconductor chips and electrically connecting the semiconductor devices of the plurality of semiconductor chips, an MEMS chip mounted on the multilayered structure and provided with an MEMS device, wherein pads connecting to the penetrating electrodes are provided on the MEMS chip.

8 Claims, 7 Drawing Sheets

ELECTRONIC APPARATUS

BACKGROUND

1. Technical Field

The present invention relates to an electronic apparatus.

2. Related Art

MEMS (Micro Electro Mechanical Systems) is one of micro structure formation technologies and refers to a technology of forming micro electromechanical systems on the order of micrometers and resulting products.

Recently, in the field of timing devices represented by quartz oscillators and ceramic oscillators, attraction has been focused on timing devices using MEMS devices. Further, in the fields of automobiles, controllers and the like, attraction has been focused on acceleration sensors and gyro sensors using MEMS devices as means for detecting location information. In an electronic apparatus using the MEMS devices, functions of high value have been realized by combining the MEMS devices and memories and logic circuits.

For example, Patent Document 1 (WO 2007/147137) discloses an electronic apparatus in which an MEMS chip with an MEMS device formed thereon and a control chip with an integrated circuit formed thereon are electrically connected via wire bonding.

However, in the electronic apparatus of Patent Document 1, the MEMS chip and the control chip are electrically connected via wire bonding, and downsizing of the apparatus has been difficult. For example, in the electronic apparatus of Patent Document 1, the control chip should be larger than the MEMS chip for forming an area for connection of bonding wires on the control chip and downsizing of the apparatus has been difficult.

SUMMARY

An advantage of some aspects of the invention is to provide an electronic apparatus that may be downsized.

An electronic apparatus according to an aspect of the invention includes a multilayered structure in which a plurality of semiconductor chips provided with semiconductor devices are stacked, a penetrating electrode penetrating the semiconductor chips and electrically connecting the semiconductor devices of the plurality of semiconductor chips, an MEMS chip mounted on the multilayered structure and provided with an MEMS device, wherein a pad connecting to the penetrating electrode is provided on the MEMS chip.

According to the electronic apparatus, the semiconductor chips are connected by the penetrating electrode and the MEMS chip is connected to the penetrating electrode by the pad, and thus, downsizing may be realized compared to the case where the semiconductor chips and the MEMS chip and the semiconductor chip are connected using wire bonding, for example. Further, the penetrating electrode is not necessarily formed in the MEMS chip, and thereby, the degree of freedom of choice of a substrate forming the MEMS chip is higher.

The electronic apparatus according to the aspect of the invention may be configured such that a recess part is provided on a surface of the multilayered structure facing the MEMS chip.

According to the electronic apparatus of this configuration, stress applied to the MEMS chip may be relaxed.

The electronic apparatus according to the aspect of the invention may be configured such that the semiconductor device of the semiconductor chip facing the MEMS chip is provided on a surface at the MEMS chip side.

According to the electronic apparatus of this configuration, an amount of radiation applied to the semiconductor device may be reduced by the MEMS chip.

The electronic apparatus according to the aspect of the invention may be configured such that the electronic apparatus further includes a thermal conduction part penetrating the semiconductor chip and having higher heat conductivity than that of the semiconductor chips, and the thermal conduction part is electrically separated from the semiconductor devices.

According to the electronic apparatus of this configuration, rise of the temperature of the apparatus may be suppressed.

The electronic apparatus according to the aspect of the invention may be configured such that the penetrating electrode is formed in center parts of the semiconductor chips as seen from a stacking direction of the semiconductor chips.

According to the electronic apparatus of this configuration, delay times of signals used in the semiconductor chips may be made shorter.

The electronic apparatus according to the aspect of the invention may be configured such that a capacitor for supplying a power supply voltage to the semiconductor device is provided on the MEMS chip.

According to the electronic apparatus of this configuration, stabilization of power supply may be realized.

The electronic apparatus according to the aspect of the invention may be configured to include a heat dissipation part formed on a surface of the MEMS chip opposite to the multilayered structure.

According to the electronic apparatus of this configuration, the rise of the temperature of the apparatus may be suppressed.

BRIEF DESCRIPTION OF THE DRAWINGS

The invention will be described with reference to the accompanying drawings, wherein like numbers reference like elements.

DESCRIPTION OF EXEMPLARY EMBODIMENTS

As below, preferred embodiments of the invention will be explained in detail using the drawings. Note that the embodiments to be explained do not unduly limit the invention described in the appended claims. Further, all of the configurations to be explained are not necessarily the essential component elements of the invention.

1. First Embodiment 1.1. Electronic Apparatus

Figure 1:
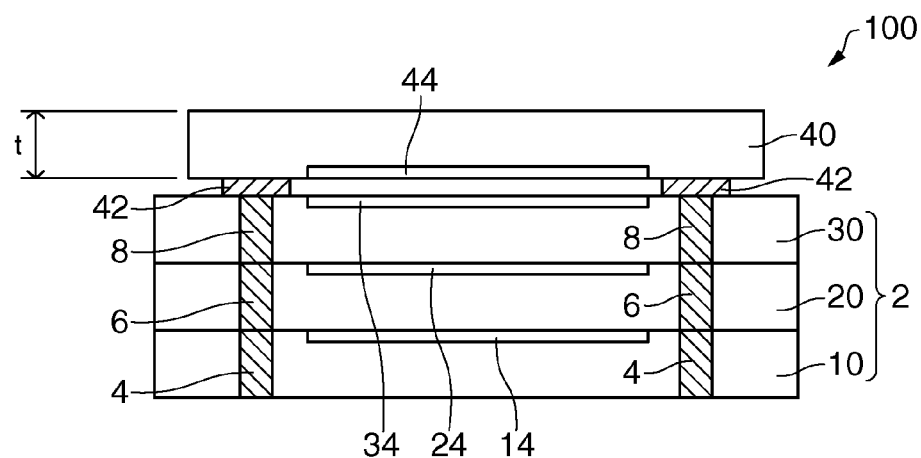
FIG. 1 is a sectional view schematically showing an electronic apparatus according to a first embodiment.
Figure 2:
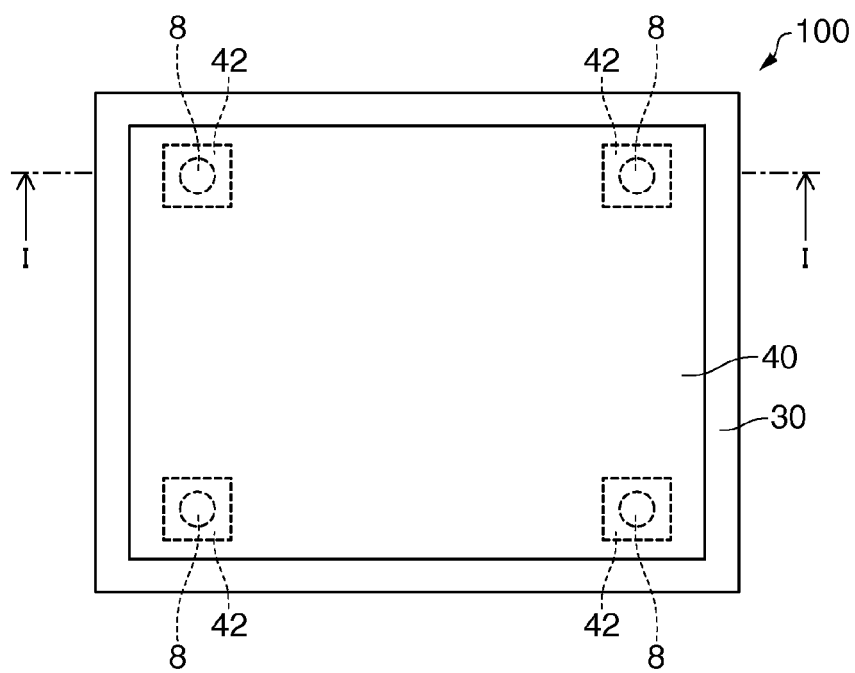
FIG. 2 is a plan view schematically showing the electronic apparatus according to the first embodiment.

First, an electronic apparatus according to the first embodiment will be explained with reference to the drawings. FIG. 1 is a sectional view schematically showing an electronic apparatus 100 according to the embodiment. FIG. 2 is a plan view schematically showing the electronic apparatus 100 according to the embodiment. Note that FIG. 1 is the sectional view taken along I-I line in FIG. 2. Further, in FIGS. 1 and 2, for convenience, semiconductor chips 10, 20, 30 and an MEMS chip 40 are simplified.

As shown in FIG. 1, the electronic apparatus 100 includes a multilayered structure 2 in which the semiconductor chips 10, 20, 30 are stacked, penetrating electrodes 4, 6, 8, and the MEMS chip 40.

The multilayered structure 2 is formed by stacking of the semiconductor chips 10, 20, 30. In the illustrated example, the multilayered structure 2 is formed by the first semiconductor chip 10, the second semiconductor chip 20 on the first semiconductor chip 10, and the third semiconductor chip 30 on the second semiconductor chip 20. Note that the number of semiconductor chips forming the multilayered structure 2 is not particularly limited, but maybe two or more. Insulating layers (not shown) may be formed between the adjacent semiconductor chips 10, 20, 30. That is, the second semiconductor chip 20 may be stacked on the first semiconductor chip 10 via the insulating layer, and the third semiconductor chip 30 may be stacked on the second semiconductor chip 20 via the insulating layer.

On the semiconductor chips 10, 20, 30, semiconductor devices are provided. The semiconductor chips 10, 20, 30 each includes a substrate, the semiconductor device formed on the substrate, and wires connected to the semiconductor device, for example. In the illustrated example, the first semiconductor chip 10 has a device formation region 14 in which the semiconductor device is formed. The second semiconductor chip 20 has a device formation region 24 in which the semiconductor device is formed. The third semiconductor chip 30 has a device formation region 34 in which the semiconductor device is formed. The semiconductor chips 10, 20, 30 may be logic chips having logic circuits formed in the device formation regions 14, 24, 34, for example. Alternatively, the semiconductor chips 10, 20, 30 may be memory chips having nonvolatile memories formed in the device formation regions 14, 24, 34, for example. In the illustrated example, the device formation regions 14, 24, 34 are formed on the upper surfaces (the surfaces at the MEMS chip 40 side) of the respective semiconductor chips 10, 20, 30. Note that, through not illustrated, the device formation regions 14, 24, 34 may be formed on the lower surfaces (the opposite surfaces to the MEMS chip 40) of the respective semiconductor chips 10, 20, 30. The first semiconductor chip 10, the second semiconductor chip 20, and the third semiconductor chip 30 have the same shape and the same size as seen from the stacking direction of the semiconductor chips 10, 20, 30, for example. The planar shape (the shape as seen from the stacking direction of the semiconductor chips 10, 20, 30) of the semiconductor chips 10, 20, 30 is rectangular, for example.

The penetrating electrode 4 penetrates the first semiconductor chip 10. The penetrating electrode 4 extends from the upper surface to the lower surface of the first semiconductor chip 10 in the stacking direction of the semiconductor chips 10, 20, 30. The penetrating electrode 4 is electrically connected to the semiconductor device formed in the device formation region 14. Further, the penetrating electrode 4 is connected to the penetrating electrode 6. In the illustrated example, four penetrating electrodes 4 are formed on the first semiconductor chip 10, but the number is not particularly limited.

The penetrating electrode 6 penetrates the second semiconductor chip 20. The penetrating electrode 6 extends from the upper surface to the lower surface of the second semiconductor chip 20 in the stacking direction of the semiconductor chips 10, 20, 30. The penetrating electrode 6 is electrically connected to the semiconductor device formed in the device formation region 24. Further, the penetrating electrode 6 is connected to the penetrating electrode 4 and the penetrating electrode 8. Four penetrating electrodes 6 are formed on the second semiconductor chip 20, but the number is not particularly limited.

The penetrating electrode 8 penetrates the third semiconductor chip 30. The penetrating electrode 8 extends from the upper surface to the lower surface of the third semiconductor chip 30 in the stacking direction of the semiconductor chips 10, 20, 30. The penetrating electrode 8 is electrically connected to the semiconductor device formed in the device formation region 34. Further, the penetrating electrode 8 is connected to the penetrating electrode 6 and pads 42. Four penetrating electrodes 8 are formed on the third semiconductor chip 30, but the number is not particularly limited.

The penetrating electrodes 4, 6, 8 are Si through-silicon vias (TSV). The penetrating electrode 4, the penetrating electrode 6, and the penetrating electrode 8 are connected and integrated and penetrate the multilayered structure 2. The penetrating electrodes 4, 6, 8 electrically connect the semiconductor devices of the semiconductor chips 10, 20, 30. Further, the penetrating electrodes 4, 6, 8 electrically connect the respective semiconductor devices of the semiconductor chips 10, 20, 30 and an MEMS device formed on the MEMS chip 40. The material of the penetrating electrodes 4, 6, 8 is W, Cu, AL, Ag, Au, or the like, for example. Furthermore, the penetrating electrodes 4, 6, 8 may have barrier layers of TiN, Ti, or the like.

For example, the penetrating electrode 4 is formed by forming a through hole from the opposite surface (rear surface) side to the surface (front surface) on which the device formation region 14 of the first semiconductor chip 10 is formed, and burying the through hole with the above described metal material. The penetrating electrodes 6, 8 are formed in the same manner. For example, the multilayered structure 2 is formed by stacking the second semiconductor chip 20 on the first semiconductor chip 10 so that the penetrating electrodes 4, 6 may be connected and the third semiconductor chip 30 on the second semiconductor chip 20 so that the penetrating electrodes 6, 8 may be connected. The penetrating electrodes 4, 6, 8 are connected using micro bump or the like, for example.

The MEMS chip 40 is mounted on the multilayered structure 2. In the illustrated example, the MEMS chip 40 is mounted on the third semiconductor chip 30. In the electronic apparatus 100, the first semiconductor chip 10, the second semiconductor chip 20, the third semiconductor chip 30, and the MEMS chip 40 are stacked in this order. The MEMS chip 40 has a device formation region 44 in which the MEMS device is formed. The device formation region 44 is formed at the multilayered structure 2 side (on the lower surface in the illustrated example).

On the MEMS chip 40, the pads 42 connecting to the penetrating electrodes 8 are provided. The pads 42 are in contact with the penetrating electrodes 8 in the illustrated example. The pads 42 are terminals for attaching the MEMS chip 40 to the third semiconductor chip 30 (multilayered structure 2). The pads 42 are bonded to the penetrating electrodes 8. The pads 42 may be bonded to the penetrating electrodes 8 via bonding members including solder, for example. The pads 42 are electrically connected to the MEMS device. Accordingly, the MEMS device of the MEMS chip 40 and the semiconductor devices of the semiconductor chips 10, 20, 30 are electrically connected via the pads 42 and the penetrating electrodes 4, 6, 8. As described above, in the electronic apparatus 100, the MEMS device of the MEMS chip 40 and the semiconductor devices of the semiconductor chips 10, 20, 30 are electrically connected via the pads 42 and the penetrating electrodes 4, 6, 8, and thus, no penetrating electrode (TSV) is formed on the MEMS chip 40. In the illustrated example, four pads 42 are provided on the MEMS chip 40, however, the number is not limited. The pads 42 are provided to overlap with the penetrating electrodes 8 as seen from the stacking direction of the semiconductor chips 10, 20, 30.

The device formation region 34 of the third semiconductor chip 30 facing the MEMS chip 40 is provided on the surface at the MEMS chip 40 side (the upper surface in the illustrated example). Further, the MEMS chip 40 is provided above the device formation region 34 of the third semiconductor chip 30. Accordingly, the MEMS chip 40 may block radiation including α-ray traveling toward the device formation region 34 of the third semiconductor chip 30. Therefore, the amount of radiation applied to the device formation region 34 of the third semiconductor chip 30 may be reduced. Thereby, occurrence of soft errors of the semiconductor device formed in the device formation region 34 may be reduced. For example, the thickness t of the MEMS chip 40 is larger than the penetration depth of the α-ray. Specifically, the thickness t of the MEMS chip 40 is 30 μm or more, for example. Thereby, the occurrence of soft errors of the semiconductor device may be reduced more effectively. Note that the radiation source of α-ray or the like is a resin (mold resin) used for packaging or the like.

Figure 3:
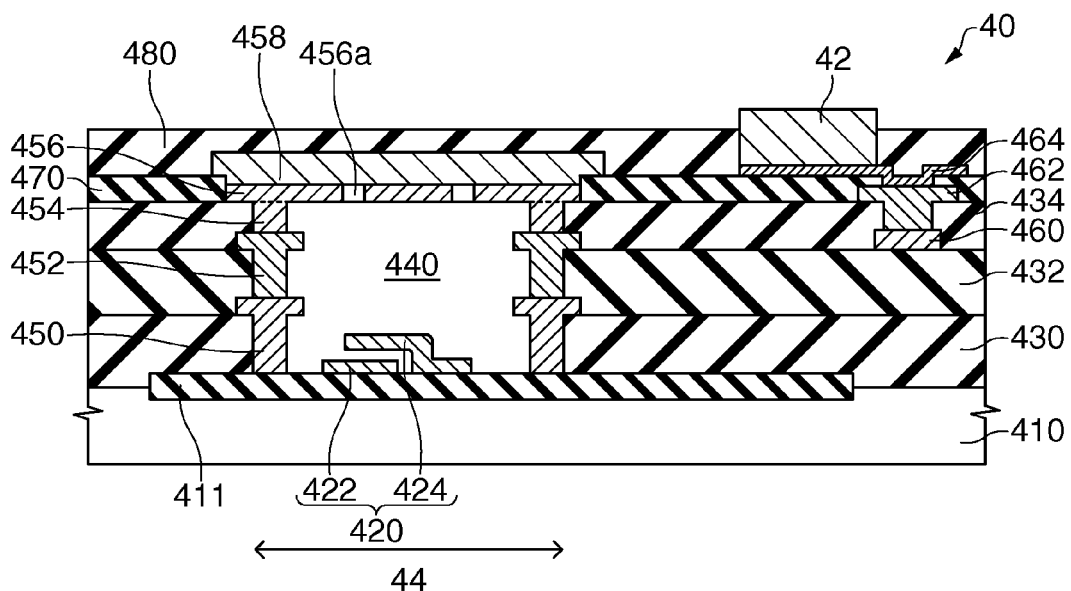
FIG. 3 is a sectional view schematically showing an MEMS chip of the electronic apparatus according to the first embodiment.

As below, the configuration of the MEMS chip 40 will be explained more specifically. FIG. 3 is a sectional view schematically showing a part of the MEMS chip 40. For convenience, FIG. 3 shows the view upside down compared to FIG. 1. Here, the case where an MEMS device 420 of the MEMS chip 40 is an MEMS vibrator will be explained.

For example, as shown in FIG. 3, the MEMS chip 40 includes a substrate 410, the MEMS device 420, interlayer insulating layers 430, 432, 434, surrounding walls 450, 452, 454, covering layers 456, 458, the pads 42, interconnections 460, 462, 464, a passivation layer 470, and a protective film 480.

As the substrate 410, for example, a semiconductor substrate including a silicon substrate is used. As the substrate 410, various substrates including a ceramics substrate, a glass substrate, a sapphire substrate, a diamond substrate, and a synthetic resin substrate may be used. No penetrating electrode is provided in the MEMS chip 40, and thus, not limited to the silicon substrate, but the above described various substrates may be used as the substrate 410. That is, the MEMS chip 40 has a high degree of freedom of choice of the substrate 410.

On the substrate 410, a foundation layer 411 is formed. The foundation layer 411 is a LOCOS (local oxidation of silicon) insulating layer, a semi-recess LOCOS insulating layer, or a trench insulating layer, for example.

The MEMS device 420 is formed on the foundation layer 411 (over the substrate 410) and housed in a cavity part 440. The MEMS device 420 is an MEMS vibrator in a cantilever shape, for example. In the illustrated example, the MEMS device 420 has a first electrode 422 formed on the foundation layer 411 and a second electrode 424 formed apart from the first electrode 422.

The second electrode 424 may have a beam part provided to face the first electrode 422. In the MEMS device 420, when a voltage (alternating voltage) is applied between the first electrode 422 and the second electrode 424, the beam part may vibrate in the thickness directions of the substrate 410 because of the electrostatic force generated between the electrodes 422, 424. In the electronic apparatus 100, the integrated circuits (semiconductor devices) formed in the device formation regions 14, 24, 34 of the semiconductor chips 10, 20, 30 and the MEMS device 420 formed on the MEMS chip 40 form an oscillator circuit. The integrated circuits and the MEMS device 420 are electrically connected via the penetrating electrodes 4, 6, 8 and the pads 42.

Note that the MEMS device 420 is not limited to the vibrator, but may be various MEMS devices including an acceleration sensor, a gyro sensor, and a micro actuator, for example.

The surrounding walls 450, 452, 454 and the covering layers 456, 458 define (designate) the cavity part 440 in which the MEMS device 420 is housed. The interior of the cavity part 440 is under a decompression condition, for example. The three interlayer insulating layers 430, 432, 434 are provided in the order of the interlayer insulating layer 430, the interlayer insulating layer 432, and the interlayer insulating layer 434 from the substrate 410 side, however, the number is not particularly limited.

The first covering layer 456 is formed to cover the cavity part 440 from above. A through hole 456a is provided in the first covering layer 456. In the process of forming the cavity part 440, an etching solution or an etching gas may be supplied through the through hole 456a.

The second covering layer 458 is formed on the first covering layer 456. The second covering layer 458 covers the through hole 456a formed in the first covering layer 456. Thereby, a gas or the like may be prevented from entering the cavity part 440 from outside through the through hole 456a.

The interconnection 460 is formed on the interlayer insulating layer 432. The interconnection 460 is electrically connected to the MEMS device 420, for example. The interconnection 460 is electrically connected to the pad 42 via the interconnection 462 penetrating the interlayer insulating layer 434 and the interconnection 464 on the passivation layer 470. That is, the pad 42 and the MEMS device 420 are electrically connected. The pad 42 is formed on the interconnection 464. The pad 42 is connected to the penetrating electrode 8 penetrating the third semiconductor chip 30. That is, the MEMS chip 40 is mounted face-down on the third semiconductor chip 30 (multilayered structure 2).

The protective film 480 is provided on the passivation layer 470, on the second covering layer 458, and on the interconnection 464. The protective film 480 protects the MEMS device 420, the interconnection 464, etc. The pad 42 is exposed from the protective film 480.

The electronic apparatus 100 according to the embodiment has the following advantages, for example.

The electronic apparatus 100 includes the multilayered structure 2 in which the plurality of semiconductor chips 10, 20, 30 provided with the semiconductor devices are stacked, the penetrating electrodes 4, 6, 8 penetrating the semiconductor chips 10, 20, 30 and electrically connecting the semiconductor chips 10, 20, 30, and the MEMS chip 40 mounted on the multilayered structure 2 and provided with the MEMS device 420, and the pads 42 connecting to the penetrating electrodes 8 are provided on the MEMS chip 40. In the electronic apparatus 100, the semiconductor chips 10, 20, 30 are connected by the penetrating electrodes 4, 6, 8, and thereby, downsizing may be realized compared to the case where the semiconductor chips 10, 20, 30 are connected via wire bonding, for example.

Further, in the electronic apparatus 100, the pads 42 connected to the penetrating electrodes 8 are provided on the MEMS chip 40. That is, the MEMS chip 40 is connected to the third semiconductor chip 30 by the pads 42. Accordingly, in the MEMS chip 40, no penetrating electrode (TSV) is formed.

Therefore, the MEMS chip 40 itself may be downsized and downsizing of the apparatus may be realized. Further, no penetrating electrode is formed in the MEMS chip 40, and thereby, various other substrates than the silicon substrate may be used as the substrate 410, and the degree of freedom of choice of the substrate 410 is higher.

According to the electronic apparatus 100, no integrated circuit is formed on the MEMS chip 40, but the integrated circuits are formed on the semiconductor chips 10, 20, 30, and thus, the older process technology generation than the process technology generation of the semiconductor chips 10, 20, 30 may be used on the MEMS chip 40. Thereby, the lower cost may be realized.

According to the electronic apparatus 100, the semiconductor device of the third semiconductor chip 30 facing the MEMS chip 40 is provided on the surface at the MEMS chip 40 side, and thus, the amount of radiation including CC-ray applied to the semiconductor device (device formation region 34) may be reduced by the MEMS chip 40. Thereby, occurrence of soft errors of the semiconductor device due to radiation may be suppressed.

1.2. Modified Examples of Electronic Apparatus

Next, modified examples of the electronic apparatus according to the first embodiment will be explained. As below, in the electronic apparatus according to the modified examples of the embodiment, the members having the same functions as the component members of the above described electronic apparatus 100 have the same signs and their detailed explanation will be omitted.

(1) First Modified Example

Figure 4:
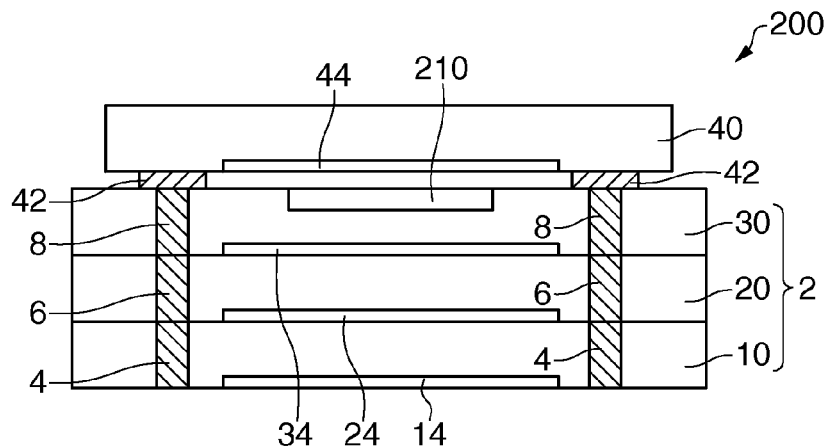
FIG. 4 is a sectional view schematically showing an electronic apparatus according to a first modified example of the first embodiment.

First, a first modified example will be explained with reference to the drawing. FIG. 4 is a sectional view schematically showing an electronic apparatus 200 according to the first modified example. Note that, in FIG. 4, for convenience, the semiconductor chips 10, 20, 30 and the MEMS chip 40 are simplified.

In the electronic apparatus 200, as shown in FIG. 4, a recess part 210 is formed on the surface of the multilayered structure 2 facing the MEMS chip 40. In the illustrated example, the recess part 210 is formed on the surface of the third semiconductor chip 30 facing the MEMS chip 40 (the upper surface in the illustrated example). The recess part 210 is formed by etching of the rear surface side (the opposite surface to the surface with the device formation region 34 thereon) of the third semiconductor chip 30, for example.

In the electronic apparatus 200, the device formation regions 14, 24, 34 are formed on the lower surfaces (the opposite surfaces to the MEMS chip 40 side) of the respective semiconductor chips 10, 20, 30.

In the electronic apparatus 200, the recess part 210 is formed on the surface of the multilayered structure 2 facing the MEMS chip 40, and thus, stress applied to the MEMS chip 40 may be relaxed.

(2) Second Modified Example

Figure 5:
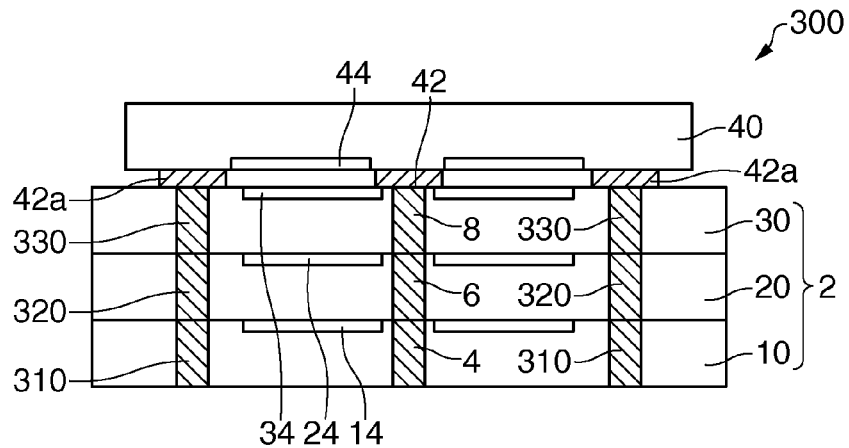
FIG. 5 is a sectional view schematically showing an electronic apparatus according to a second modified example of the first embodiment.
Figure 6:
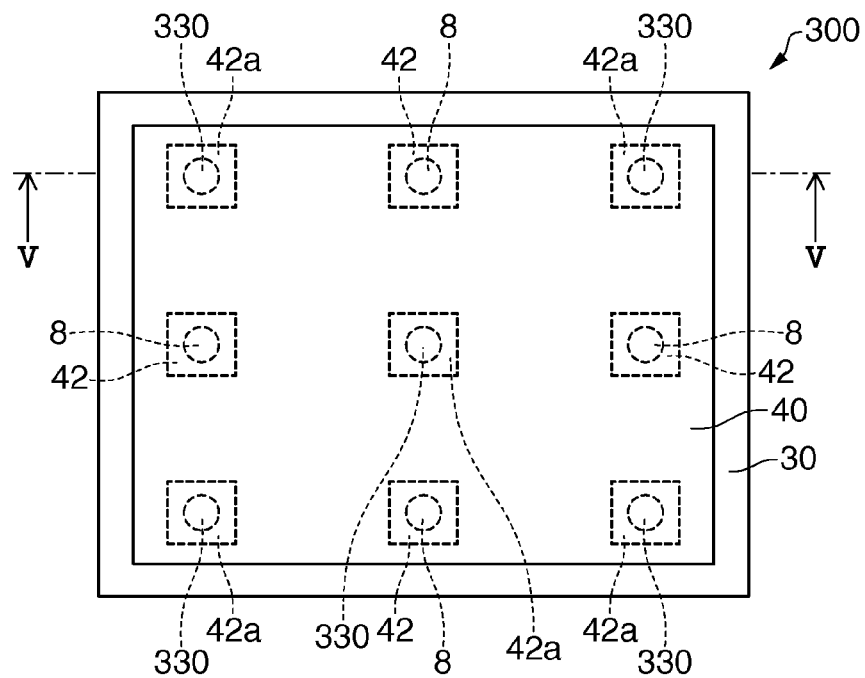
FIG. 6 is a plan view schematically showing the electronic apparatus according to the second modified example of the first embodiment.

Next, a second modified example will be explained with reference to the drawings. FIG. 5 is a sectional view schematically showing an electronic apparatus 300 according to the second modified example. FIG. 6 is a plan view schematically showing the electronic apparatus 300 according to the second modified example. Note that FIG. 5 is the sectional view taken along V-V line in FIG. 6. Further, in FIGS. 5 and 6, for convenience, the semiconductor chips 10, 20, 30 and the MEMS chip 40 are simplified.

As shown in FIGS. 5 and 6, the electronic apparatus 300 may further include thermal conduction parts 310, 320, 330 penetrating the semiconductor chips 10, 20, 30 and having higher thermal conductivity than that of the semiconductor chips 10, 20, 30 in addition to the component members of the electronic apparatus 100.

The thermal conduction part 310 penetrates the first semiconductor chip 10. The thermal conduction part 310 connects to the thermal conduction part 320. The thermal conduction part 310 is electrically separated from the semiconductor device of the first semiconductor chip 10. That is, the thermal conduction part 310 is not electrically connected to the semiconductor device or does not function as a penetrating electrode.

The thermal conduction part 320 penetrates the second semiconductor chip 20. The thermal conduction part 320 connects to the thermal conduction part 310 and the thermal conduction part 330. The thermal conduction part 320 is electrically separated from the semiconductor device of the second semiconductor chip 20. That is, the thermal conduction part 320 is not electrically connected to the semiconductor device or does not function as a penetrating electrode.

The thermal conduction part 330 penetrates the third semiconductor chip 30. The thermal conduction part 330 connects to the thermal conduction part 320 and a pad 42a. Note that, though not illustrated, the thermal conduction part 330 may not necessarily be connected to the pad 42a. The pad 42a is provided on the MEMS chip 40, but not electrically connected to the MEMS device 420. The thermal conduction part 330 is electrically separated from the semiconductor device of the third semiconductor chip 30. That is, the thermal conduction part 330 is not electrically connected to the semiconductor device or does not function as a penetrating electrode.

The thermal conduction parts 310, 320, 330 are formed in regions of the semiconductor chips 10, 20, 30 prone to heat generation or nearby. The thermal conduction parts 310, 320, 330 are provided in the center parts of the semiconductor chips 10, 20, 30 and the four corners of the semiconductor chips 10, 20, 30, for example. Five of the thermal conduction parts 310, 320, 330 are respectively provided in the respective semiconductor chips 10, 20, 30 in the illustrated example, however, the number is not particularly limited. The thermal conduction part 310, the thermal conduction part 320, and the thermal conduction part 330 are connected and integrated and penetrate the multilayered structure 2. The material of the thermal conduction parts 310, 320, 330 is the same as the material of the penetrating electrodes 4, 6, 8, for example. The method of manufacturing the thermal conduction parts 310, 320, 330 is the same as the method of manufacturing the penetrating electrodes 4, 6, 8, for example.

The electronic apparatus 300 includes the thermal conduction parts 310 penetrating the semiconductor chips 10, 20, 30 and having the higher thermal conductivity than that of the semiconductor chips 10, 20, 30, and thus, heat dissipation may be improved. Thereby, the rise of the temperature of the apparatus may be suppressed. Further, in the case where the thermal conduction parts 330 are connected to the MEMS chip 40, the difference in temperature between the MEMS chip 40 and the semiconductor chips 10, 20, 30 may be made smaller, and therefore, temperature control of the MEMS chip 40 may be easily performed by providing temperature sensor functions or the like to the semiconductor chips 10, 20, 30, for example.

(3) Third Modified Example

Figure 7:
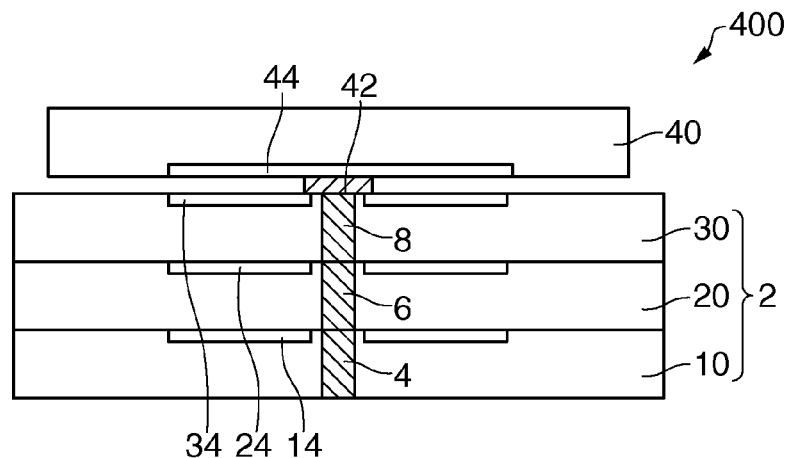
FIG. 7 is a sectional view schematically showing an electronic apparatus according to a third modified example of the first embodiment.
Figure 8:
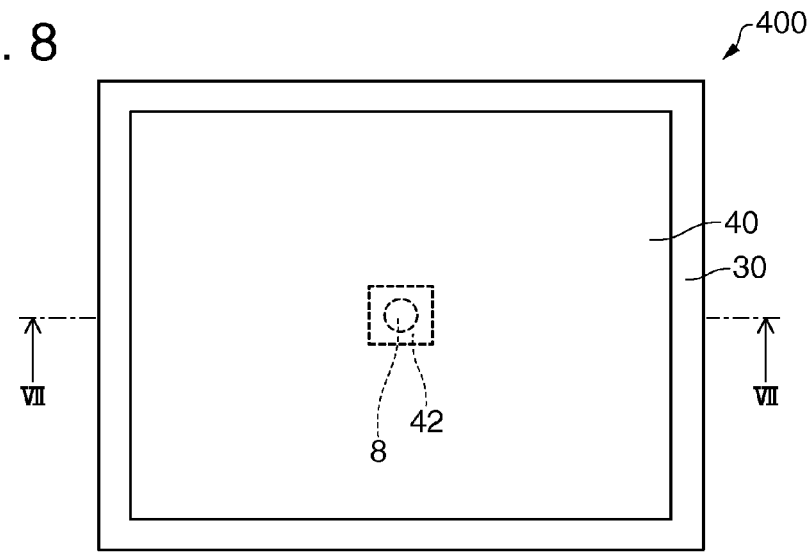
FIG. 8 is a plan view schematically showing the electronic apparatus according to the third modified example of the first embodiment.

Next, a third modified example will be explained with reference to the drawings. FIG. 7 is a sectional view schematically showing an electronic apparatus 400 according to the third modified example. FIG. 8 is a plan view schematically showing the electronic apparatus 400 according to the third modified example. Note that FIG. 7 is the sectional view taken along VII-VII line in FIG. 8. Further, in FIGS. 7 and 8, for convenience, the semiconductor chips 10, 20, 30 and the MEMS chip 40 are simplified.

In the electronic apparatus 400, as shown in FIGS. 7 and 8, the penetrating electrodes 4, 6, 8 are provided in the center parts of the semiconductor chips 10, 20, 30 as seen from the stacking direction of the semiconductor chips 10, 20, 30.

In the illustrated example, the semiconductor chips 10, 20, 30 have rectangular shapes as seen from the stacking direction of the semiconductor chips 10, 20, 30. The penetrating electrodes 4, 6, 8 are provided at the centers (where diagonal lines intersect) of the semiconductor chips 10, 20, 30 as seen from the stacking direction of the semiconductor chips 10, 20, 30.

According to the electronic apparatus 400, the penetrating electrodes 4, 6, 8 are provided in the center parts of the semiconductor chips 10, 20, 30 as seen from the stacking direction of the semiconductor chips 10, 20, 30, and thus, delay times of the signals used in the semiconductor chips 10, 20, 30 may be made shorter. For example, in the case where the penetrating electrodes 4, 6, 8 are provided in the corner parts of the semiconductor chips 10, 20, 30 as seen from the stacking direction of the semiconductor chips 10, 20, 30, the distances to the opposite corner parts are longer and the delay times become longer.

Note that, for example, using a device which measures the delay times from the MEMS chip 40 to the first semiconductor chip 10 in the location farthest from the MEMS chip 40, the clock signals from the MEMS chip 40 with an MEMS oscillator may be supplied to the respective semiconductor chips 10, 20, 30 at times when necessary.

(4) Fourth Modified Example

Figure 9:
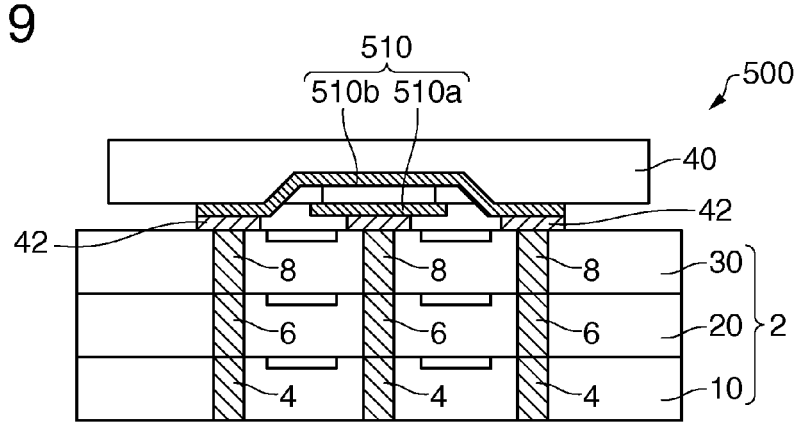
FIG. 9 is a sectional view schematically showing an electronic apparatus according to a fourth modified example of the first embodiment.

Next, a fourth modified example will be explained with reference to the drawing. FIG. 9 is a sectional view schematically showing an electronic apparatus 500 according to the fourth modified example. Note that, in FIG. 9, for convenience, the semiconductor chips 10, 20, 30 and the MEMS chip 40 are simplified.

In the electronic apparatus 500, as shown in FIG. 9, a power supply capacitor 510 for supplying a power supply voltage to the semiconductor devices of the semiconductor chips 10, 20, 30 is provided on the MEMS chip 40.

In the illustrated example, the power supply capacitor 510 includes a first electrode 510a, and a second electrode 510b provided to face the first electrode 510a. The power supply capacitor 510 may supply the power supply voltage to the semiconductor chips 10, 20, 30 via the penetrating electrodes 4, 6, 8. Further, for example, in the power supply capacitor 510, a power supply of VDD and GND is supplied to the semiconductor chips 10, 20, 30 by the adjacent penetrating electrodes 4, 6, 8, and thereby, fluctuations of the power supply voltage may be reduced by the coupling capacity between VDD and GND. The power supply capacitor 510 is provided to avoid the device formation region in which the MEMS device is provided.

According to the electronic apparatus 500, the power supply capacitor 510 is provided on the MEMS chip 40, and thus, stabilization of power supply may be realized.

(5) Fifth Modified Example

Figure 10:
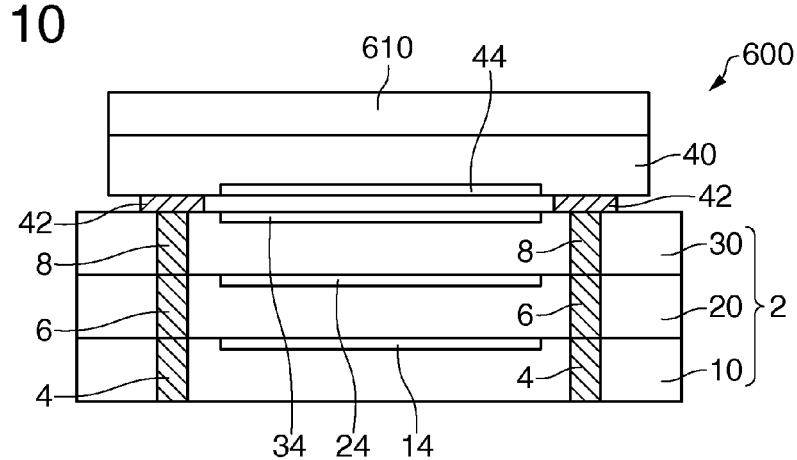
FIG. 10 is a sectional view schematically showing an electronic apparatus according to a fifth modified example of the first embodiment.

Next, a fifth modified example will be explained with reference to the drawing. FIG. 10 is a sectional view schematically showing an electronic apparatus 600 according to the fifth modified example. In FIG. 10, for convenience, the semiconductor chips 10, 20, 30 and the MEMS chip 40 are simplified.

In the electronic apparatus 600, as shown in FIG. 10, a heat dissipation part 610 is provided on the surface of the MEMS chip 40 opposite to the multilayered structure 2.

The heat dissipation part 610 is provided on the surface opposite to the surface having the device formation region 44 in which the MEMS device is formed. The heat dissipation part 610 may suppress rise of the temperature of the electronic apparatus 600. The heat dissipation part 610 dissipates heat by air cooling or liquid cooling, for example. The heat dissipation part 610 is a heat sink, a heat pipe, or the like, for example.

In the electronic apparatus 600, the heat dissipation part 610 is provided, and thus, the rise of the temperature of the electronic apparatus 600 maybe suppressed.

2. Second Embodiment

Figure 11:
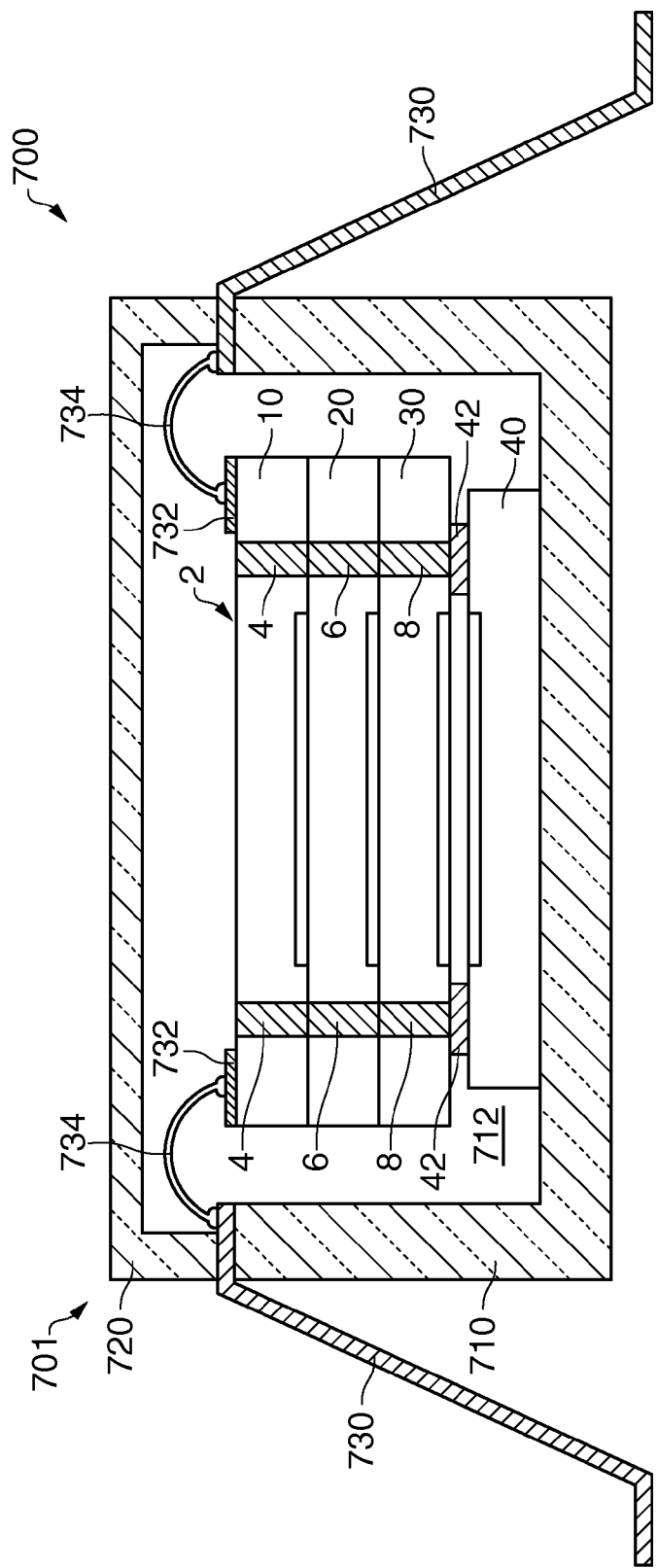
FIG. 11 is a sectional view schematically showing an electronic apparatus according to a second embodiment.

Next, an electronic apparatus according to the second embodiment will be explained with reference to the drawing. FIG. 11 is a sectional view schematically showing an electronic apparatus 700 according to the second embodiment.

Note that, in FIG. 11, for convenience, the semiconductor chips 10, 20, 30 and the MEMS chip 40 are simplified.

As shown in FIG. 11, the electronic apparatus 700 further includes a package 701 in addition to the component members of the electronic apparatus 100. The package 701 may house the semiconductor chips 10, 20, 30 and the MEMS chip 40.

The package 701 may have a package base 701, a lid 720, and a lead frame 730.

In the package base 710, a recess part 712 is formed, and the multilayered structure 2 and the MEMS chip 40 are provided within the recess part 712. The planar shape of the package base 710 is not particularly limited as long as the multilayered structure 2 and the MEMS chip 40 may be provided within the recess part 712. As the package base 710, for example, a material including an aluminum oxide sintered body formed by shaping, stacking, and sintering ceramic green sheets, quartz, glass, and silicon is used.

The lid 720 is provided to cover the recess part 712 of the package base 710. As the lid 720, for example, the same material as that of the package base 710 may be used. The lid 720 is bonded to the package base 710 via a bonding member including a seam ring, low-melting-point glass, an adhesive agent (not shown), for example.

The air-tightly sealed interior of the recess part 712 of the package base 710 may be under a decompressed vacuum condition (high vacuum condition), or a condition filled with an inert gas of nitride, helium, argon, or the like.

The lead frame 730 may connect the semiconductor chips 10, 20, 30 and the MEMS chip 40 housed in the package 701 and external wiring (not shown). In the illustrated example, the lead frame 730 is connected to rear surface electrodes 732 of the first semiconductor chip 10 via wires 734 made of aluminum or gold. The rear surface electrodes 732 are electrically connected to the penetrating electrodes 4, for example. Further, the lead frame 730 may support and secure the package 701.

Figure 12:
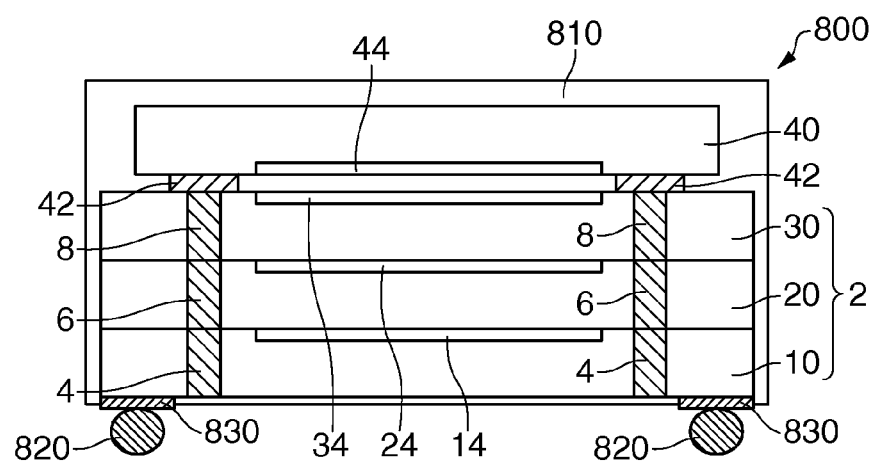
FIG. 12 is a sectional view schematically showing an electronic apparatus according to a modified example of the second embodiment.

FIG. 12 is a sectional view schematically showing an electronic apparatus 800 according to a modified example of the second embodiment. Note that, in FIG. 12, for convenience, the semiconductor chips 10, 20, 30 and the MEMS chip 40 are simplified.

As shown in FIG. 12, the electronic apparatus 800 is a CSP including a WCSP (Wafer level Chip size package), for example. The semiconductor chips 10, 20, 30 and the MEMS chip 40 are covered by a resin 810. In the electronic apparatus 800, the semiconductor chips 10, 20, 30 and the MEMS chip 40 and external wiring (not shown) may be electrically connected via solder balls 820. In the illustrated example, the solder balls 820 are connected to rear surface electrodes 830 of the first semiconductor chip 10. The rear surface electrodes 830 are electrically connected to the penetrating electrodes 4.

3. Third Embodiment

Figure 13:
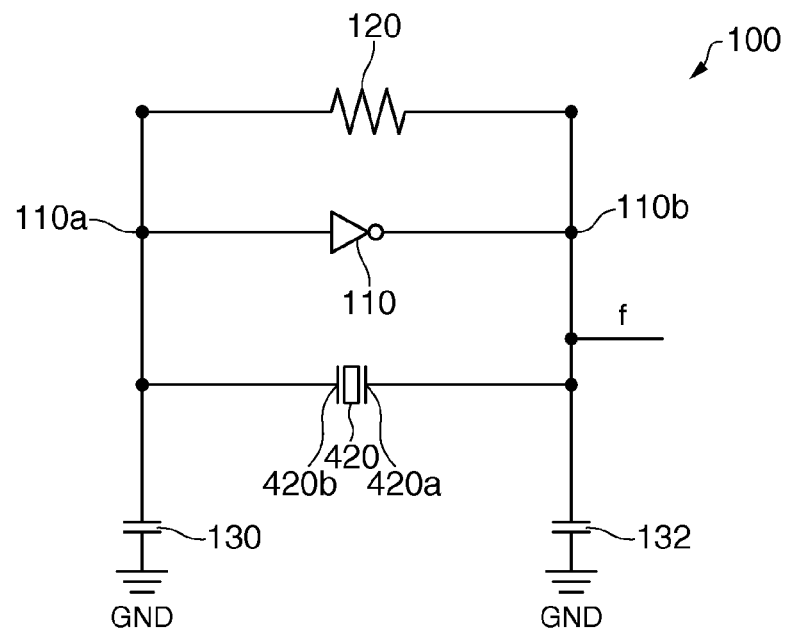
FIG. 13 is a circuit diagram showing an oscillator according to a third embodiment.

Next, as the third embodiment, the case where the electronic apparatus according to an aspect of the invention is an oscillator will be explained with reference to the drawing. As below, the case where the electronic apparatus 100 is an oscillator will be explained. FIG. 13 is a circuit diagram showing the electronic apparatus (oscillator) 100 according to the third embodiment.

As shown in FIG. 13, the electronic apparatus 100 includes the MEMS device (MEMS vibrator) 420 and an inverting amplifier circuit 110, for example. The inverting amplifier circuits 110 are provided on the semiconductor chips 10, 20, 30 shown in FIG. 1, for example.

The MEMS device 420 has a first terminal 420a electrically connected to the first electrode 422 (see FIG. 3), and a second terminal 420b electrically connected to the second electrode 424 (see FIG. 3). The first terminal 420a of the MEMS device 420 is at least alternately connected to an output terminal 110b of the inverting amplifier circuit 110. The second terminal 420b of the MEMS device 420 is at least alternately connected to an input terminal 110a of the inverting amplifier circuit 110.

In the illustrated example, the inverting amplifier circuit 110 includes one inverter, however, may be formed by combining a plurality of inverters (inverting circuits) and amplifier circuits for satisfaction of a desired oscillation condition.

The electronic apparatus 100 may include a feedback resistor with respect to the inverting amplifier circuit 110. In the example shown in FIG. 13, the input terminal and the output terminal of the inverting amplifier circuit 110 are connected via a resister 120.

The electronic apparatus 100 includes a first capacitor 130 connected between the input terminal 110a of the inverting amplifier circuit 110 and a reference potential (ground potential), and a second capacitor 132 connected between the output terminal 110b of the inverting amplifier circuit 110 and a reference potential (ground potential). Thereby, an oscillator circuit in which a resonator circuit is formed by the MEMS device 420 and the capacitors 130, 132 may be obtained. The electronic apparatus 100 outputs an oscillation signal f obtained by the oscillator circuit.

Figure 14:
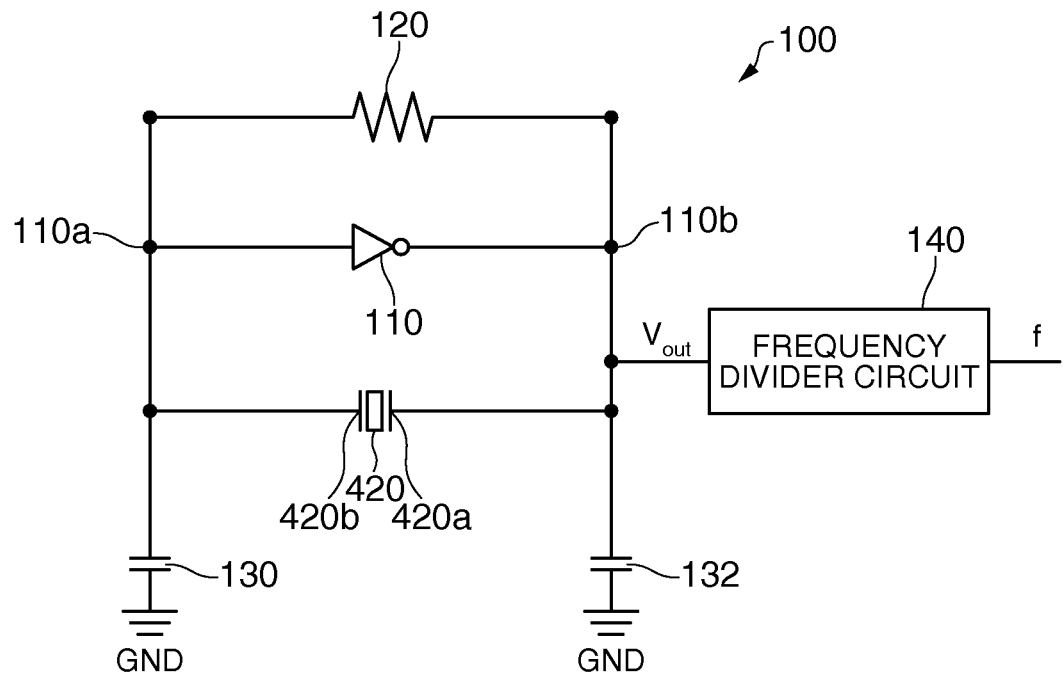
FIG. 14 is a circuit diagram showing an oscillator according to a modified example of the third embodiment.

As shown in FIG. 14, the electronic apparatus 100 may further have a frequency divider circuit 140. The frequency divider circuit 140 divides the frequency of the output signal Vout of the oscillator circuit and outputs the oscillation signal f. Thereby, the electronic apparatus 100 may obtain an output signal at the lower frequency than the frequency of the output signal Vout, for example.

Note that, here, the case where the electronic apparatus 100 is an oscillator including the MEMS device (MEMS vibrator) 420 is explained, however, the electronic apparatus 100 may be an acceleration sensor, a gyro sensor, a relay using an MEMS contact, or the like as long as it may be an apparatus including an MEMS device.

The above described embodiments and modified examples are just examples, and not limited to those. For example, the respective embodiments and the respective modified examples may be appropriately combined.

The invention includes substantially the same configurations (the same configurations in function, method, and result or the same configurations in purpose and advantage) as the configurations explained in the embodiments. Further, the invention includes configurations in which non-essential parts of the configurations explained in th embodiments are replaced. Furthermore, the invention includes configurations that may exert the same effects or achieve the same purposes as those of the configurations explained in the embodiments. In addition, the invention includes configurations formed by adding known technologies to the configurations explained in the embodiments.

The entire disclosure of Japanese Patent Application No. 2012-202374, filed Sep. 14, 2012 is expressly incorporated by reference herein.

What is claimed is:

1. An electronic apparatus comprising:
   a multilayered structure in which a plurality of semiconductor chips provided with semiconductor devices are stacked;
   a plurality of penetrating electrodes penetrating the semiconductor chips and electrically connecting the semiconductor devices of the plurality of semiconductor chips, each of the semiconductor chips including one of the plurality of penetrating electrodes such that a first penetrating electrode in a first semiconductor chip is directly electrically connected to a second penetrating electrode in a second semiconductor chip;
   an MEMS chip mounted on the multilayered structure and provided with an MEMS device, wherein a pad connecting to the plurality of penetrating electrodes is provided on the MEMS chip, and wherein the plurality of penetrating electrodes connect to a first side of the pad and the MEMS chip is provided on a second side of the pad, opposite the first side, such that the plurality of penetrating electrodes do not extend through the MEMS chip.

2. The electronic apparatus according to claim 1, wherein a recess part is provided on a surface of the multilayered structure facing the MEMS chip.

3. The electronic apparatus according to claim 1, wherein the semiconductor device of the semiconductor chip facing the MEMS chip is provided on a surface at the MEMS chip side.

4. The electronic apparatus according to claim 1, further comprising a thermal conduction part penetrating the semiconductor chips and having higher heat conductivity than that of the semiconductor chips, wherein the thermal conduction part is electrically separated from the semiconductor devices.

5. The electronic apparatus according to claim 1, wherein each of the plurality of penetrating electrodes is formed in a center part of each of the semiconductor chips as seen from a stacking direction of the semiconductor chips.

6. The electronic apparatus according to claim 1, wherein, a capacitor for supplying a power supply voltage to the semiconductor device is provided on the MEMS chip.

7. The electronic apparatus according to claim 1, wherein a heat dissipation part is provided on a surface of the MEMS chip opposite to the multilayered structure.

8. The electronic apparatus according to claim 1, wherein the semiconductor devices are stacked directly contacting each other.

* * * * *